(12) United States Patent
Chen et al.

(10) Patent No.: US 7,667,275 B2
(45) Date of Patent: Feb. 23, 2010

(54) USING OXYNITRIDE SPACER TO REDUCE PARASITIC CAPACITANCE IN CMOS DEVICES

(75) Inventors: Yuanning Chen, Plano, TX (US); Haowen Bu, Plano, TX (US); Kaiping Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 896 days.

(21) Appl. No.: 10/938,179

(22) Filed: Sep. 11, 2004

(65) Prior Publication Data
US 2006/0054934 A1 Mar. 16, 2006

(51) Int. Cl.
*H01L 23/62* (2006.01)
(52) U.S. Cl. .............................. 257/386; 257/E21.626
(58) Field of Classification Search ................ 257/386, 257/E21.626
See application file for complete search history.

(56) References Cited

U.S. PATENT DOCUMENTS

| | | | |
|---|---|---|---|
| 6,677,201 B1 | 1/2004 | Bu et al. | |
| 6,743,705 B2 | 6/2004 | Mehrotra et al. | |
| 2002/0055230 A1* | 5/2002 | Chang | 438/258 |
| 2002/0140100 A1* | 10/2002 | Yokoyama | 257/760 |
| 2002/0182795 A1* | 12/2002 | Bae et al. | 438/200 |
| 2003/0085436 A1* | 5/2003 | Moore | 257/408 |

* cited by examiner

*Primary Examiner*—Bradley K Smith
*Assistant Examiner*—Amar Movva
(74) *Attorney, Agent, or Firm*—Rose Alyssa Keagy; Wade J. Brady, III; Frederick J. Telecky, Jr.

(57) ABSTRACT

A complementary metal oxide semiconductor (CMOS) device has a substrate 100, a gate structure 108 disposed atop the substrate, and spacers 250, deposited on opposite sides of the gate structure 108 to govern formation of deep source drain regions S, D in the substrate. Spacers 250 are formed of an oxynitride ($SiO_xN_yC_z$) wherein x and y are non-zero but z may be zero or greater; such oxynitride spacers reduce parasitic capacitance, thus improving device performance. A method of fabricating a portion of a complementary metal oxide semiconductor (CMOS) device involves providing a substrate 100, forming a gate structure 108 over the substrate, depositing a first layer 104 atop the substrate on opposite sides of the gate structure to govern formation of deep source drain regions in the substrate, depositing an oxynitride ($SiO_xN_yC_z$) layer 250 atop the first layer (in which x and y are non-zero but z may be zero or greater), depositing a second layer 112 atop the oxynitride layer, and depositing a nitride layer 114B atop the second layer.

2 Claims, 2 Drawing Sheets

USING OXYNITRIDE SPACER TO REDUCE PARASITIC CAPACITANCE IN CMOS DEVICES

BACKGROUND OF THE INVENTION

1. Field of the Invention

The invention relates to arrangements for reducing parasitic capacitance in complementary metal oxide semiconductor (CMOS) devices (such as $C_{GD}$ between the gate and the drain or source, and $C_{GC}$ between the gate and source/drain contacts). More specifically, the invention relates to arrangements employing a sidewall spacer made of oxynitride to reduce parasitic capacitance and to thus increase the speed of CMOS transistors.

2. Related Art

FIG. 1 shows a conventional CMOS transistor having a source S and drain D embedded in a substrate 100 which may be made of silicon. A gate dielectric layer 102 is provided between symmetrically arranged L-shaped structures 104. A gate 108, conventionally made of polysilicon, is provided atop the dielectric layer 102. Structure 110 is a silicide layer and is conventionally made of cobalt silicide (CoSi) or nickel silicide (NiSi). On opposite sides of the gate structure 108, a stack is provided that includes:

- a first oxide layer 104 (may also be nitride, or a combination of oxide and nitride),
- followed by a first nitride layer 114A,
- followed by a second oxide layer 112,
- followed by a second nitride layer 114B, which is known as the contact etch stop layer or pre-metal dielectric (PMD) liner.

In the finished device, the second nitride layer 114B effectively joins with first nitride layer 114A to surround oxide structure 112. Source and drain contacts (not specifically illustrated, usually made of metal (tungsten)) are provided atop outlying portions of the source drain extensions (SDEs) such as by etching through the top dielectric. The CMOS transistor of FIG. 1 may be fabricated according to well known techniques (such as those disclosed in, for example, U.S. Pat. Nos. 6,743,705 and 6,677,201 which are incorporated herein by reference).

Structure 114A has conventionally served the purpose of a spacer to help define deep source and deep drain regions (S and D, respectively), which reduces the hot carrier problem and helps to prevent overrun of source and drain given recent technology advances. In conventional CMOS devices, the practice and trend has been to use spacers 114A made of pure nitride.

However, the dielectric constant of pure nitride (that is, pure silicon nitride $Si_3N_4$) is $\in = 7.5$, and the nitride spacer causes parasitic capacitance (such as the total gate to source/drain capacitance $C_{GD}$, and gate to source/drain contact capacitance $C_{GC}$) to be undesirably high. Undesirably, higher parasitic capacitance slows the transistor's operation. Accordingly, there is a need in the art to provide a spacer that has the advantages of conventional spacer arrangements but without having their disadvantages.

SUMMARY

A complementary metal oxide semiconductor (CMOS) device has a substrate, a gate structure 108 disposed atop the substrate, and spacers, deposited on opposite sides of the gate structure to govern formation of deep source drain regions in the substrate. The spacers are formed of an oxynitride ($SiO_xN_yC_z$) in which x and y are non-zero but z may be zero or greater.

A method of fabricating a portion of a complementary metal oxide semiconductor (CMOS) device involves providing a substrate, forming a gate structure over the substrate, depositing a first layer atop the substrate on opposite sides of the gate structure to govern formation of deep source drain regions in the substrate, depositing an oxynitride ($SiO_xN_yC_z$) layer atop the first layer (in which x and y are non-zero but z may be zero or greater), depositing a second layer atop the oxynitride layer, and depositing a nitride layer atop the second layer.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which.

DETAILED DESCRIPTION

Figure 1:
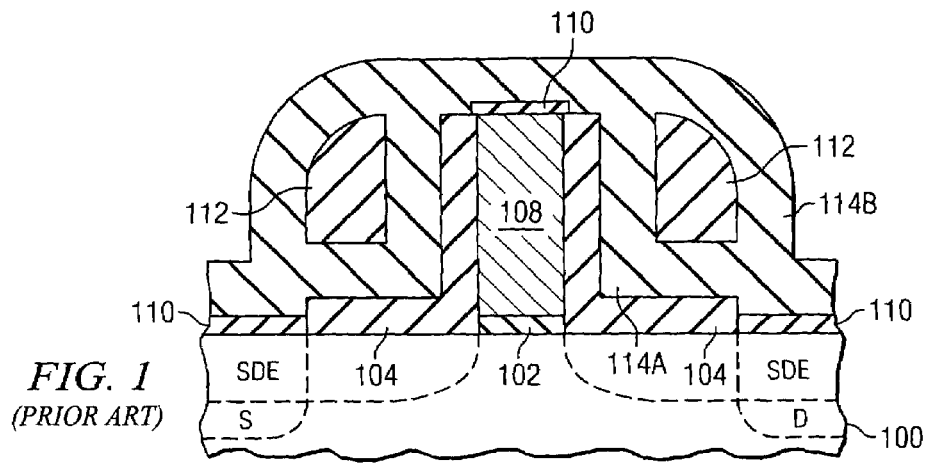
FIG. 1 illustrates a conventional CMOS transistor that includes a pure nitride spacer 114A that results in a high parasitic capacitance ($C_{GD}$ between the gate and source or drain, and $C_{GC}$ between gate and source/drain contacts)

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used in interpreting the claims.

Moreover, features and procedures whose implementations are well known to those skilled in the art are omitted for brevity. For example, design, selection, and implementation of basic electronic elements and fabrication steps, lies within the ability of those skilled in the art, and accordingly any detailed discussion thereof may be omitted.

The present inventors have recognized that, contrary to the present trend to use pure nitride spacers 114A in CMOS devices, spacers made of oxynitride ($SiO_xN_y$) or carbon doped oxynitride ($SiO_xN_yC_z$) reduce parasitic capacitance and thus increase the operational speed of the CMOS transistors. Various elements FIG. 2 may be sized, arranged, and composed of materials similar to those in the conventional CMOS transistor of FIG. 1, and a description thereof may be omitted. Likewise, a fabrication method of the FIG. 2 embodiment may incorporate well known methods employed to form conventional CMOS transistors, except as specifically noted below with reference to the oxynitride spacer 250; accordingly, a detailed discussion of conventional fabrication steps is omitted.

Figure 2:
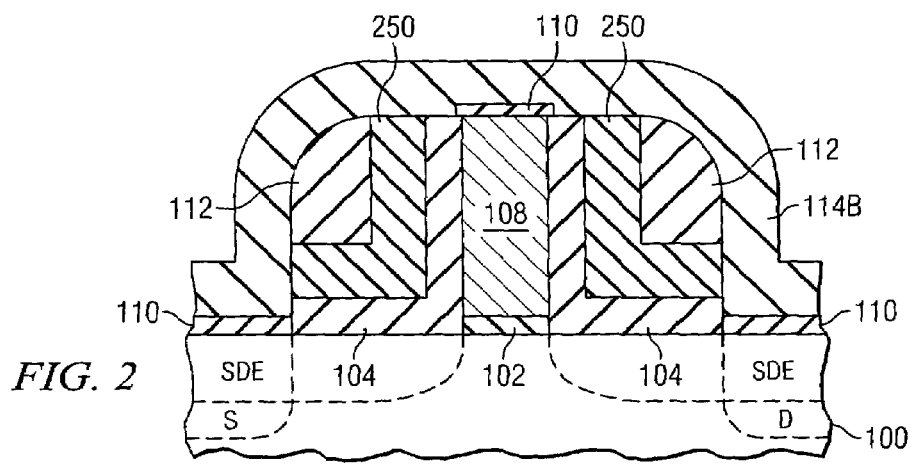
FIG. 2 illustrates on embodiment in which an oxynitride spacer 250 is provided so as to reduce parasitic capacitance and thus increase device performance.

The FIG. 2 embodiment provides a spacer 250 made of oxynitride ($SiO_xN_y$) or carbon doped oxynitride ($SiO_xN_yC_z$), not nitride (such as $Si_3N_4$), resulting in the aforementioned reduction in parasitic capacitance and resultant increase in transistor speed. In the illustrated embodiment, the spacer 250 happens to be of an "L" shape; of course, it is recognized that the spacer may be shaped other than as specifically illustrated.

Figure 3A:
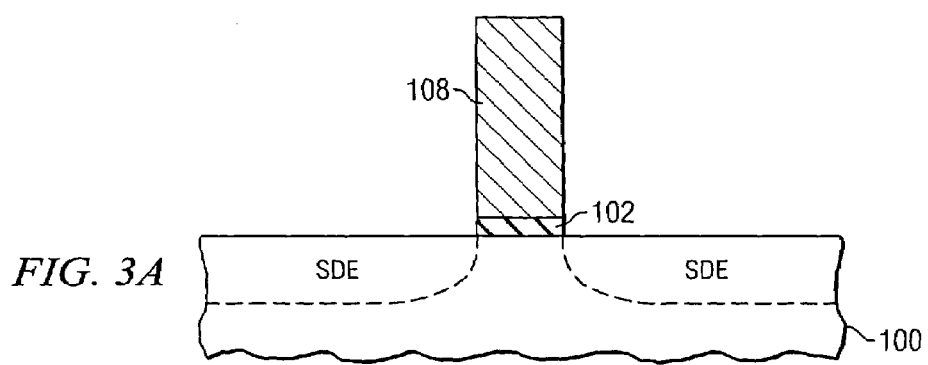
FIGS. 3A, 3B and 3C illustrate structures involved in stages of a fabrication process that forms the embodiment shown in FIG. 2.
Figure 3B:
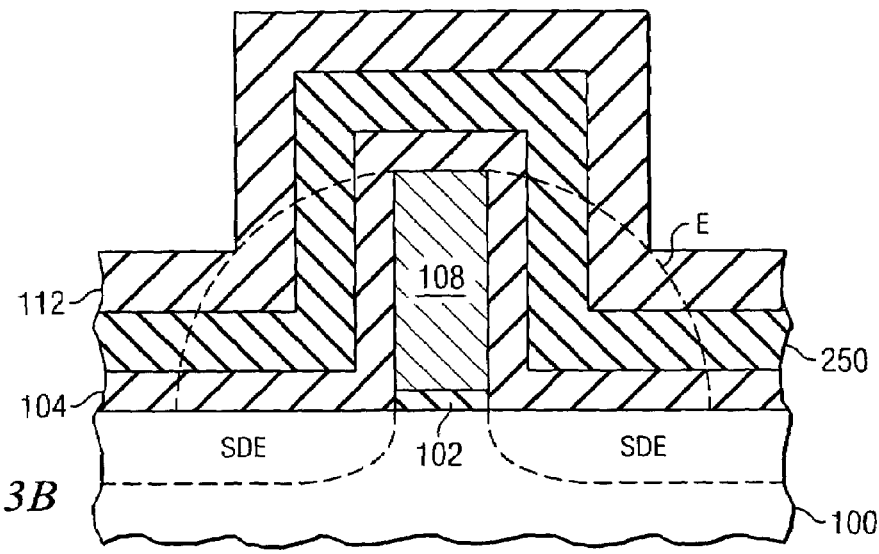
Figure 3C:
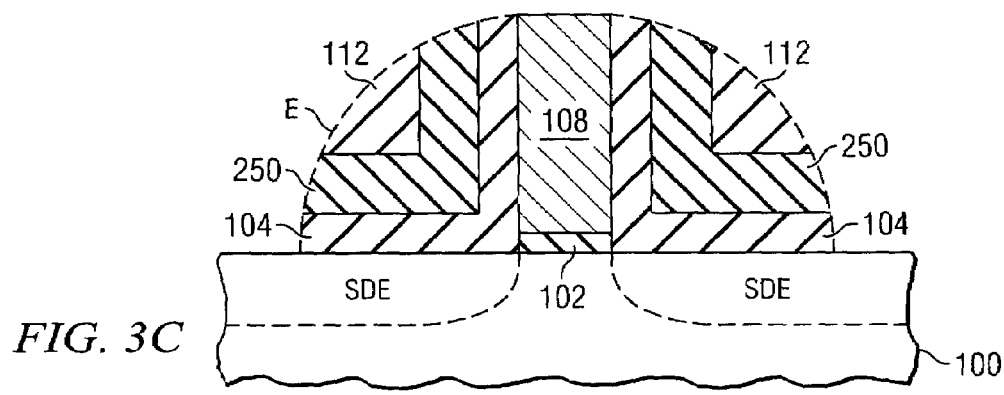

The structure shown in FIG. 2 may be fabricated in a manner illustrated in FIGS. 3A, 3B and 3C.

Referring to FIG. 3A, a gate 108 is shown atop gate dielectric layer 102 which is atop the substrate 100 in which are formed source and drain extension (SDE) regions.

Thereafter, successive layers of a first oxide 104, an oxynitride 250, and a second oxide 112 are deposited, as shown in FIG. 3B. Then, the resulting structure is etched along a line E, removing material above line E to arrive at the structure shown in FIG. 3C.

Deep source drain implant is then performed with n-type dopants (such as arsenic (As) or phosphorus (P)) for nFET devices, or with p-type dopants (such as boron (B)) for pFET devices. This results in the deep source drain regions, S, D, respectively, shown in FIG. 2. The dopants are activated by a rapid thermal annealing (RTA) process. A CoSi or NiSi layer 110 is deposited atop the substrate, and a PMD liner nitride layer 114B is deposited atop the resulting structure, to form the CMOS transistor of FIG. 2.

Most steps in the process may be carried out in the same manner in which the conventional CMOS transistor of FIG. 1 is fabricated, and, accordingly, a detailed description thereof is omitted. However, this embodiment's fabrication method involves deposition of oxynitride rather than pure nitride to form spacer 250, and the particular deposition step differs from that of conventional fabrication methods.

Oxynitride spacer 250 may be deposited using low pressure chemical vapor deposition (LPCVD) in which the reactive gases include:

$SiH_4$ (silane) or $Si_2H_6$ (disilane),
$NH_3$ (ammonia) and
$N_2O$ (nitrous oxide) or other oxidants.

In contrast to the fabrication methods resulting in the embodiment of FIG. 2, conventional LPCVD silicon nitride arrangements are not believed to include an oxidant such as nitrous oxide. But in fabricating the FIG. 2 embodiment, as a result of using an inert carrier gas such as $N_2$ (nitrogen) and an oxidant such as nitrous oxide, the final device includes a spacer, which may be an L-shaped spacer, that is made of oxynitride ($SiO_xN_y$) as distinguished from pure nitride (such as $Si_3N_4$).

An exemplary process is conducted in a rapid thermal chemical vapor deposition (RTCVD) at 600-700° C.:

$SiH_4$ flow is 1-20 sccm (standard centimeter cube per minute),
$NH_3$ flow is 1000-4000 sccm, and
$N_2O$ flow is 20-500 sccm.

Oxynitrides ($SiO_xN_y$) may be fabricated with different ratios x/y of oxygen and nitrogen by varying the $N_2O$ to $NH_3$ gas flow ratio. Bracketing the oxynitride of which spacer 250 may be fabricated, are oxides ($SiO_2$, which has a dielectric constant $\in=3.9$), and pure nitrides ($Si_3N_4$, which has a dielectric constant $\in=7.5$). In contrast, oxynitrides may choose an oxygen/nitrogen ratio x/y to provide a dielectric constant along a continuum between the extremes of 3.9 and 7.5. In one embodiment to which the invention should not be limited, in ($SiO_xN_y$), x and y are chosen so that x=y=1.

In simulations in which $\in=4.5$, significant reductions in parasitic capacitance $C_{GD}$ of from 10 to 17 percent were arrived at, depending on the particular device configuration. In addition to the advantage of lower parasitic capacitance and resulting higher transistor switching speed, oxynitride spacers are easy to form using existing manufacturing processes. In particular, the process involves a substitution of an oxynitride (250) deposition step for a conventional nitride (114A) deposition step. Moreover, oxynitrides normally have lower hydrogen content. Better boron retention is achieved due to reduced hydrogen enhance dopant loss, leading to a lower $R_{SD}$ (source drain parasitic sheet resistance).

In another embodiment, an organic precursor (such as bis t-ButylaminoSilane (BTBAS, $C_8H_{22}N_2Si$)) is used instead of silane or disilane. In this embodiment, the reactive gases include:

$C_8H_{22}N_2Si$ (BTBAS) or other organic precursors,
$NH_3$ (ammonia) and
$N_2O$ (nitrous oxide) or other oxidants.

In this embodiment, a carbon doped oxynitride layer ($SiO_xN_yC_z$) 250 is formed, with 5-10 atomic percent carbon in the film. The carbon concentration, however, is tunable over a wide range with process conditions. With carbon doped oxynitride, further reduction in parasitic capacitance and dopant loss is achieved.

Figure 4:
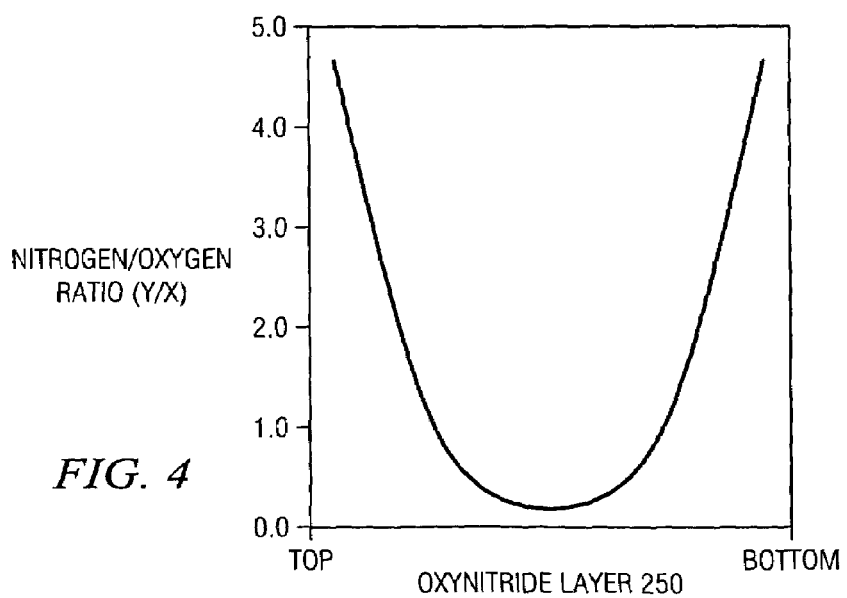
FIG. 4 illustrates the ratio of nitrogen/oxygen (y/x) in a variable graded composition oxynitride spacer 250.

In yet another embodiment, instead of a constant composition throughout the $SiO_xN_y$ or $SiO_xN_yC_z$ layer 250, an oxynitride film with a graded O/N ratio is formed. For example, oxygen contribution x is approximately 0 at the top and bottom of the layer 250, so that y/x approaches infinity (extreme ends of the curve in FIG. 4). Thus, at the top and bottom of oxynitride layer 250, the film resembles silicon nitride. However, nitrogen contribution y is approximately 0 at the middle the layer 250 so that the film resembles silicon oxide (the middle of the curve in FIG. 4). By using a variable composition film for layer 250, etch selectivity is improved at the interfaces between oxide 104 and oxynitride 250, and between oxide 112 and oxynitride 250, while the overall dielectric constant $\in$ is kept low.

The present disclosure supports a complementary metal oxide semiconductor (CMOS) device that has a substrate (100); a gate structure (108) disposed atop the substrate; and spacers (250), deposited on opposite sides of the gate structure (108) to govern formation of deep source drain regions in the substrate, the spacers being formed of an oxynitride ($SiO_xN_yC_z$) wherein x and y are non-zero but z may be zero or greater.

The spacers may be substantially "L"-shaped.

The spacers may be substantially "L"-shaped and may be sandwiched between two oxide layers (104, 112).

In addition to the oxynitride, the spacers that govern formation of the deep source drain regions may further include an oxide layer (104) deposited between the oxynitride (250) and the substrate (100), but the spacers do not include an oxide layer (112) deposited atop the oxynitride (250).

The spacers may be formed of an oxynitride having a dielectric constant $\in$ of about 4.5.

In the spacers formed of oxynitride ($SiO_xN_yC_z$), x and y may be set equal to 1 and y may be greater than or equal to zero.

In the spacers formed of oxynitride ($SiO_xN_yC_z$), z may be greater than zero to form a carbon doped oxynitride.

The device may further have source and drain extension regions (SDE), embedded in the substrate (100), and formed on opposite sides of the gate structure (108) and over which respective spacers (250) are located.

The spacers (250) formed of oxynitride ($SiO_xN_yC_z$) may have a nitrogen/oxygen ratio that varies as a function of depth, with less oxygen content near faces of the oxynitride layer than at a center of the oxynitride layer so that a nitrogen/oxygen ratio is greatest near the faces of the oxynitride layer.

The present disclosure also supports a complementary metal oxide semiconductor (CMOS) transistor. The CMOS transistor may have a substrate (100); a gate structure (108) located over the substrate; a first oxide layer (104) atop the substrate on opposite sides of the gate structure; an oxynitride ($SiO_xN_yC_z$) layer (250) atop the first oxide layer, and deposited on opposite sides of the gate structure (108) to govern formation of deep source drain regions in the substrate, wherein x and y are non-zero but z may be zero or greater; a second oxide layer (112) atop the oxynitride layer; a silicide (110) disposed on the substrate outwardly from the first oxide layer; and a nitride layer (14B) atop the second oxide layer (112) and atop the silicide (110).

The oxynitride layer (250) may be formed into two "L"-shaped spacers disposed on opposite sides of the gate structure (108).

The value of z may be set to be greater than zero to form a carbon doped oxynitride.

The oxynitride ($SiO_xN_yC_z$) layer may have a nitrogen/oxygen ratio that varies as a function of depth, with less oxygen content near faces of the oxynitride layer than at a center of the oxynitride layer so that a nitrogen/oxygen ratio is greatest near the faces of the oxynitride layer.

The present disclosure further supports a method of fabricating a portion of a complementary metal oxide semiconductor (CMOS) device. The method may involve providing a substrate (100); forming a gate structure (108) over the substrate; depositing a first layer (104) atop the substrate on opposite sides of the gate structure to govern formation of deep source drain regions in the substrate; depositing an oxynitride ($SiO_xN_yC_z$) layer (250) atop the first layer, wherein x and y are non-zero but z may be zero or greater; depositing a second layer (112) atop the oxynitride layer; and depositing a nitride layer (14B) atop the second layer.

The oxynitride depositing step may be a low pressure chemical vapor deposition (LPCVD) process.

The LPCVD process may involve gas mixtures including ammonia and nitrous oxide.

The oxynitride layer depositing step may include depositing a carbon doped oxynitride ($SiO_xN_yC_z$) layer (250), wherein z>0, using an organic precursors such as bis t-Buty-laminoSilane (BTBAS, $C_8H_{22}N_2Si$).

The oxynitride layer depositing step may include forming the oxynitride ($SiO_xN_yC_z$) layer (250) with a nitrogen/oxygen ratio that varies as a function of depth, with less oxygen content near faces of the oxynitride layer than at a center of the oxynitride layer so that a nitrogen/oxygen ratio is greatest near the faces of the oxynitride layer.

Many alternatives, modifications, and variations will be apparent to those skilled in the art in light of the above teachings. For example, the particular ratio of oxygen to nitrogen in the oxynitride, the particular physical dimensions of the device layers involved, and the particular details of the fabrication steps chosen, may be varied while still remaining within the scope of the invention. It is therefore to be understood that within the scope of the appended claims and their equivalents, the invention may be practiced otherwise than as specifically described herein.

What is claimed is:

1. A complementary metal oxide semiconductor (CMOS) device, comprising:
   a substrate;
   a gate structure disposed atop the substrate; and
   spacers, deposited on opposite sides of the gate structure to govern formation of deep source drain regions in the substrate, the spacers being formed of an oxynitride ($SiO_xN_yC_z$) wherein x and y are non-zero but z may be zero or greater, and the oxynitride spacers having a nitrogen/oxygen ratio that varies as a function of depth;
   wherein the spacers formed of oxynitride ($SiO_xN_yC_z$) have less oxygen content near faces of the oxynitride layer than at a center of the oxynitride layer so that a nitrogen/oxygen ratio is greatest near the faces of the oxynitride layer.

2. A complementary metal oxide semiconductor (CMOS) transistor, comprising:
   a substrate;
   a gate structure located over the substrate;
   a first oxide layer atop the substrate on opposite sides of the gate structure;
   an oxynitride ($SiO_xN_yC_z$) layer atop the first oxide layer, and deposited on opposite sides of the gate structure to govern formation of deep source drain regions in the substrate, the oxynitride layer having a nitrogen/oxygen ratio that varies as a function of depth, wherein x and y are non-zero but z may be zero or greater;
   a second oxide layer atop the oxynitride layer;
   a silicide disposed on the substrate outwardly from the first oxide layer; and
   a nitride layer atop the second oxide layer and atop the silicide;
   wherein the oxynitride ($SiO_xN_yC_z$) layer has less oxygen content near faces of the oxynitride layer than at a center of the oxynitride layer so that a nitrogen/oxygen ratio is greatest near the faces of the oxynitride layer.

* * * * *

UNITED STATES PATENT AND TRADEMARK OFFICE
CERTIFICATE OF CORRECTION

PATENT NO. : 7,667,275 B2  Page 1 of 1
APPLICATION NO. : 10/938179
DATED : February 23, 2010
INVENTOR(S) : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 877 days.

Signed and Sealed this

Twenty-eighth Day of December, 2010

David J. Kappos
*Director of the United States Patent and Trademark Office*